US012687909B2

(12) United States Patent
Koerner et al.

(10) Patent No.: US 12,687,909 B2
(45) Date of Patent: Jul. 21, 2026

(54) DATA CENTER ELECTRICAL POWER DISTRIBUTION WITH MODULAR MECHANICAL COOLING ISOLATION

(71) Applicant: Critical Project Services, LLC, Dallas, TX (US)

(72) Inventors: Matthew Douglas Koerner, Ashburn, VA (US); John A. Musilli, Jr., San Diego, CA (US)

(73) Assignee: Critical Project Services, LLC, Dallas, TX (US)

( * ) Notice: Subject to any disclaimer, the term of this patent is extended or adjusted under 35 U.S.C. 154(b) by 184 days.

(21) Appl. No.: 18/064,215

(22) Filed: Dec. 9, 2022

(65) Prior Publication Data

US 2023/0185350 A1 Jun. 15, 2023

Related U.S. Application Data

(60) Provisional application No. 63/288,450, filed on Dec. 10, 2021.

(51) Int. Cl.
*G06F 1/30* (2006.01)
*G06F 1/28* (2006.01)
*H05K 7/20* (2006.01)

(52) U.S. Cl.
CPC .................. *G06F 1/30* (2013.01); *G06F 1/28* (2013.01); *H05K 7/20272* (2013.01); *H05K 7/20763* (2013.01)

(58) Field of Classification Search
CPC ......... G06F 1/28; G06F 1/30; H05K 7/20272; H05K 7/20763
See application file for complete search history.

(56) References Cited

U.S. PATENT DOCUMENTS

| | | | | | |
|---|---|---|---|---|---|
| 6,563,706 | B1 * | 5/2003 | Strickler | ............ | H05K 7/20718 |
| | | | | | 165/122 |
| 8,681,479 | B2 * | 3/2014 | Englert | ................ | H05K 7/1497 |
| | | | | | 361/813 |
| 10,014,713 | B1 * | 7/2018 | Nguyen | .................. | H02J 9/061 |

(Continued)

OTHER PUBLICATIONS

International Search Report and Written Opinion issued Mar. 9, 2023 regarding International Application No. PCT/US2022/081384, 10 pages.

(Continued)

*Primary Examiner* — Aurel Prifti

(57) ABSTRACT

A system includes one or more power distribution blocks configured to provide power to multiple computing devices in a data center. The system also includes a redundancy power distribution block configured to provide redundant power to the computing devices in the data center. The system further includes multiple mechanical cooling electrical distribution blocks electrically coupled to the redundancy power distribution block, each mechanical cooling electrical distribution block configured to provide mechanical cooling to the computing devices in the data center. In response to detection of a power failure in at least one of the mechanical cooling electrical distribution blocks, the redundancy power distribution block is further configured to provide electrical power to the at least one mechanical cooling electrical distribution block exhibiting the power failure.

16 Claims, 3 Drawing Sheets

(56)            References Cited

U.S. PATENT DOCUMENTS

| | | | | |
|---|---|---|---|---|
| 10,965,148 | B1 * | 3/2021 | Wang | G06F 1/3287 |
| 11,287,868 | B1 * | 3/2022 | Sturm | G06F 1/30 |
| 11,333,384 | B1 * | 5/2022 | Karimi | G05B 13/048 |
| 11,729,952 | B2 * | 8/2023 | Oxley | G05B 9/03 |
| | | | | 700/282 |
| 11,733,762 | B2 * | 8/2023 | Wolford | G06F 1/30 |
| | | | | 713/322 |
| 11,868,191 | B1 * | 1/2024 | Wang | G06F 1/305 |
| 2002/0101715 | A1 * | 8/2002 | Osecky | H05K 7/20836 |
| | | | | 714/E11.144 |
| 2005/0034468 | A1 * | 2/2005 | Dietz | F21V 29/67 |
| | | | | 62/236 |
| 2005/0154499 | A1 * | 7/2005 | Aldridge | F02G 5/00 |
| | | | | 700/286 |
| 2011/0156480 | A1 * | 6/2011 | Park | H02J 9/061 |
| | | | | 307/23 |
| 2013/0120929 | A1 | 5/2013 | Bianculli et al. | |
| 2014/0029196 | A1 | 1/2014 | Smith | |
| 2014/0070616 | A1 * | 3/2014 | Shih | G06F 1/30 |
| | | | | 307/64 |
| 2014/0208130 | A1 * | 7/2014 | Morales | H02J 9/04 |
| | | | | 713/300 |
| 2014/0229765 | A1 * | 8/2014 | Grimshaw | G06F 11/2015 |
| | | | | 714/14 |
| 2015/0036266 | A1 * | 2/2015 | Emert | H05K 7/1497 |
| | | | | 361/624 |
| 2015/0051749 | A1 | 2/2015 | Hancock et al. | |
| 2015/0355630 | A1 * | 12/2015 | Cader | G05B 19/408 |
| | | | | 700/9 |
| 2015/0370301 | A1 * | 12/2015 | Bolan | G06F 1/263 |
| | | | | 713/322 |
| 2017/0315184 | A1 * | 11/2017 | Morin | G01R 31/40 |
| 2019/0004579 | A1 * | 1/2019 | Allen-Ware | G06F 1/3228 |
| 2020/0260616 | A1 | 8/2020 | Oxley | |
| 2020/0348993 | A1 * | 11/2020 | Ozonat | G06N 3/08 |
| 2021/0303059 | A1 * | 9/2021 | Wang | G06F 1/3278 |
| 2021/0373636 | A1 * | 12/2021 | Thibaut | G06F 1/28 |
| 2022/0050516 | A1 * | 2/2022 | Sudo | H02J 9/06 |

OTHER PUBLICATIONS

Extended European Search Report issued Oct. 17, 2025 regarding Application No. 22905455.6, 7 pages.

* cited by examiner

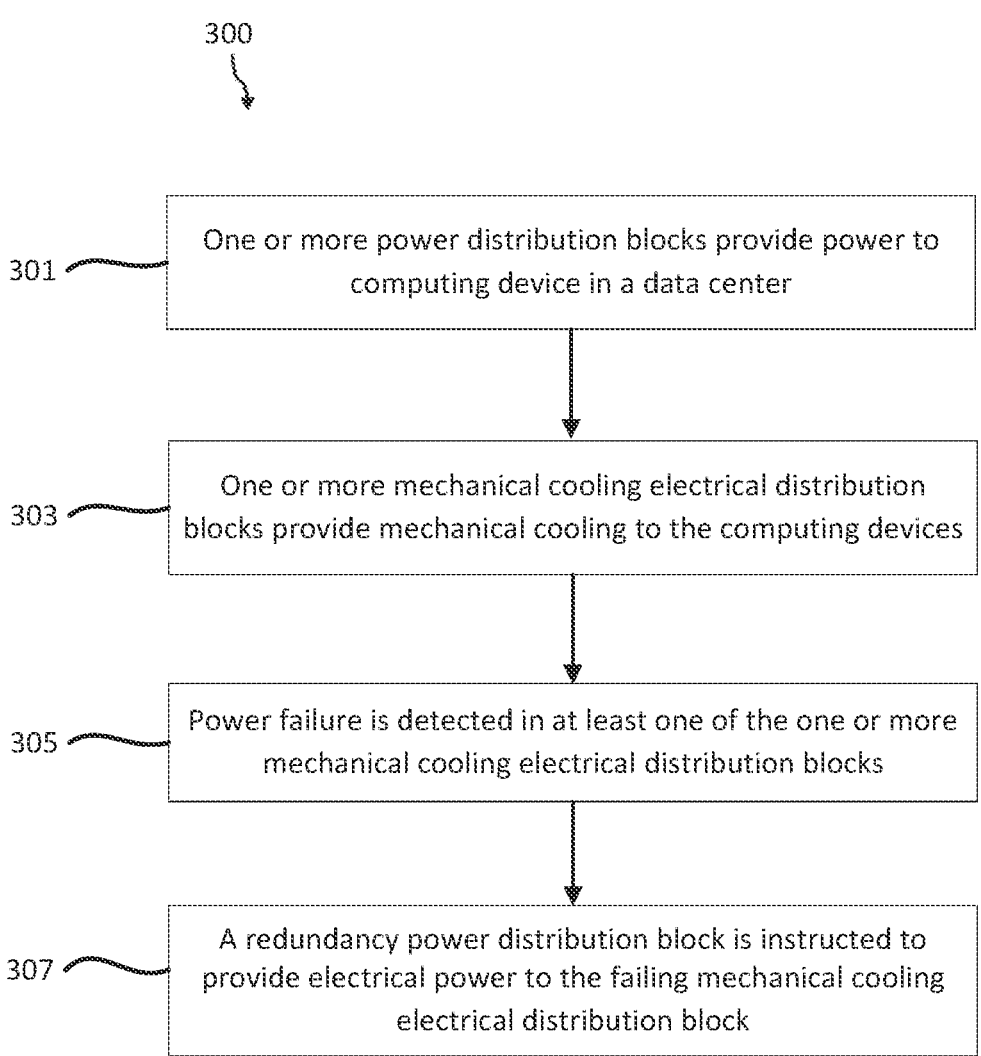

300

301 — One or more power distribution blocks provide power to computing device in a data center 303 — One or more mechanical cooling electrical distribution blocks provide mechanical cooling to the computing devices 305 — Power failure is detected in at least one of the one or more mechanical cooling electrical distribution blocks 307 — A redundancy power distribution block is instructed to provide electrical power to the failing mechanical cooling electrical distribution block

FIG. 3

DATA CENTER ELECTRICAL POWER DISTRIBUTION WITH MODULAR MECHANICAL COOLING ISOLATION

CROSS-REFERENCE TO RELATED APPLICATIONS AND PRIORITY CLAIM

This application claims priority under 35 U.S.C. § 119(e) to U.S. Provisional Patent Application No. 63/288,450 filed on Dec. 10, 2021, which is hereby incorporated by reference in its entirety.

TECHNICAL FIELD

Embodiments of the present disclosure relate to data centers and, in particular, to systems and methods for data center electrical power distribution with modular mechanical cooling isolation.

BACKGROUND

Conventional data center electrical power distribution typically includes one or more incoming power sources connected to a common site or building electrical switch gear lineup, with distribution to the data center critical compute loads and the mechanical loads downstream of the site metering point(s). The data center critical power distribution and the mechanical equipment are on a common path and upstream source. One of the main principles of data center design is redundancy. The redundancy principle is applied to both the electrical distribution and electrical capacity and the mechanical electrical distribution, mechanical cooling distribution, and mechanical capacity.

SUMMARY

This disclosure provides systems and methods for data center electrical power distribution with modular mechanical cooling isolation.

In a first embodiment, a system includes one or more power distribution blocks configured to provide power to multiple computing devices in a data center. The system also includes a redundancy power distribution block configured to provide redundant power to the computing devices in the data center. The system further includes multiple mechanical cooling electrical distribution blocks electrically coupled to the redundancy power distribution block, each mechanical cooling electrical distribution block configured to provide mechanical cooling to the computing devices in the data center. In response to detection of a power failure in at least one of the mechanical cooling electrical distribution blocks, the redundancy power distribution block is further configured to provide electrical power to the at least one mechanical cooling electrical distribution block exhibiting the power failure.

In a second embodiment, a method includes providing power to multiple computing devices in a data center using one or more power distribution blocks. The method also includes providing mechanical cooling to the computing devices in the data center using multiple mechanical cooling electrical distribution blocks. The method further includes detecting a power failure in at least one of the mechanical cooling electrical distribution blocks. In addition, the method includes, in response to detecting the power failure in the at least one mechanical cooling electrical distribution block, providing electrical power to the at least one mechanical cooling electrical distribution block using a redundancy power distribution block electrically coupled to the multiple mechanical cooling electrical distribution blocks. The redundancy power distribution block is further configured to provide redundant power to the computing devices in the data center.

Other technical features may be readily apparent to one skilled in the art from the following figures, descriptions, and claims.

BRIEF DESCRIPTION OF THE DRAWINGS

FIG. 3 is a flowchart illustrating an example process for providing redundant electrical power for mechanical cooling according to this disclosure.

DETAILED DESCRIPTION

Figure 1:
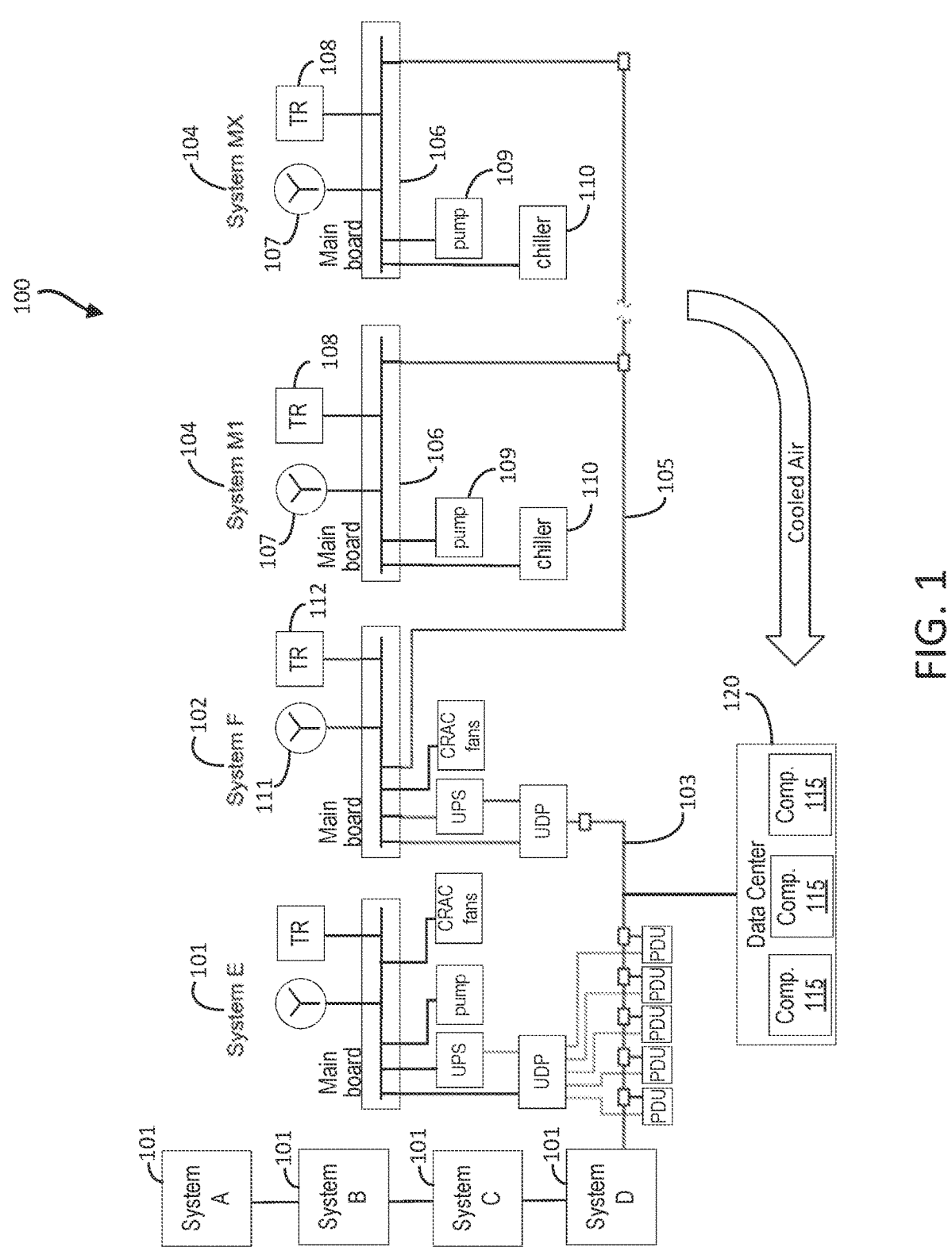
FIG. 1 illustrates an example data center electrical power distribution system according to this disclosure.

The figures discussed below and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure. It will be understood that embodiments of this disclosure may include any one, more than one, or all of the features described here. Also, embodiments of this disclosure may additionally or alternatively include other features not listed here.

As discussed above, conventional data center electrical power distribution typically includes one or more incoming power sources connected to a common site or building electrical switch gear lineup, with distribution to the data center critical compute loads and the mechanical loads downstream of the site metering point(s). The data center critical power distribution and the mechanical equipment electrical distribution are on a common path and upstream source. One of the main principles of data center design is redundancy. The redundancy principle is applied to both the electrical distribution and electrical capacity and the mechanical electrical distribution, mechanical cooling distribution, and mechanical capacity.

In the simplest designs, with the lowest reliability, the electrical and mechanical systems have one each of critical components. The capacity of the critical components is equal to the demand of the workload. In the most common redundancy scenario "N+1," the system includes one additional piece of critical equipment or increment of capacity. Most cloud data center designs include redundancy techniques and components as part of the design. The redundancy improves the reliability of the facility in terms of uptime for the computer equipment. In many systems, the uptime expectation is 99.999% uptime for the critical compute load. This is often described as "Five Nines uptime."

From a data center design perspective, the critical compute load of the computing equipment only has one solution vector for success, which is to provide uninterrupted electrical power to the device. This can be achieved through a well-designed and tested power distribution solution. The data center computing equipment also typically has a few specific cooling requirements that are provided by airflow and or fluid flow. In general, data center cooling or heat rejection solutions come in many form factors, from simple openings in the building allowing air to migrate through the space to very equipment-intensive and complicated designs and installations. In addition, cooling designs are evolving technologies and therefore there is no consistent or preferred solution.

To address these and other issues, embodiments of the present disclosure feature a flexible, modular mechanical cooling electrical distribution design, in which modular mechanical equipment with a segregated electrical distribution can be added to any data center electrical system as an "add on." The disclosed embodiments provide a modular mechanical equipment electrical isolation topology that can be added to the site in increments as prescribed by the owner or specifications. The disclosed embodiments represent an improvement over traditional integrated data center electrical designs that combine the critical compute load and data center critical mechanical electrical load together, thus tying the two to a specific (i.e., non-modular, not flexible) mechanical cooling solution. Other benefits will be apparent to those of skill in the art.

FIG. 1 illustrates an example data center electrical power distribution system 100 according to this disclosure. The embodiment of the system 100 shown in FIG. 1 is for illustration only. Other embodiments of the system 100 could be used without departing from the scope of this disclosure.

As shown in FIG. 1, the system 100 includes multiple power distribution blocks 101 (labeled "System A" through "System E") and a redundancy power distribution block 102 (labeled "System F"). The power distribution blocks 101 comprise an "N" configuration electrical equipment line up, where each of the power distribution blocks 101 includes various equipment (e.g., one or more transformers, generators, pumps, fans, uninterruptible power supplies (UPSs), power distribution units (PDUs), UPS distribution panels, and the like) used to support a data center critical load by providing power to multiple computing devices 115 in a data center 120. While FIG. 1 shows "System A" through "System D" as simplified blocks, this is merely for readability of the drawing. It will be understood that "System A" through "System D" can be configured the same as, or similar to, "System E."

To provide redundancy, the system 100 includes a redundancy power distribution block 102 in the line up with an electrical path 103 to each of the critical data center compute loads. The redundancy power distribution block 102 has a power capacity equal to or greater than the power loads associated with the individual power distribution blocks 101. With the presence of the redundancy power distribution block 102, the system 100 has a redundant source, in capacity and components, and is considered "N+1." This is also commonly described as Isolated Redundant configuration. Configuration of the redundancy power distribution block 102 may include, but is not limited to, any of the following solutions individually or in combination with each other: fossil fuel powered (e.g., diesel, natural gas, gasoline, propane, and the like) internal combustion engine generator, turbo generator powered by compressed air, turbo generator powered by liquid air, steam turbine powered generator, wind turbine generator, hydrogen powered generator, and the like.

While the system 100 is shown with five power distribution blocks 101, this is merely one example. Other embodiments can include any number of power distribution blocks 101 greater than one. When supported by the redundancy power distribution block 102 for the "N+1" redundancy, the electrical distribution capabilities of the system 100 can meet the requirements of the data center.

The system 100 also includes multiple modular mechanical cooling electrical distribution blocks 104 (labeled "System M1" and "System MX") for cooling electrical isolation. The mechanical cooling electrical distribution blocks 104 provide mechanical cooling to the computing devices 115 in the data center 120. The mechanical cooling electrical distribution blocks 104 are modular and can be added to a site or detached from the site, as needed to meet mechanical cooling requirements, without impacting other parts of the system 100. As used herein, modular refers to the construction and/or standardization of the components of the mechanical cooling electrical distribution blocks 104, and/or a standardized connectivity of the mechanical cooling electrical distribution blocks 104 to the existing system 100. In some embodiments, each modular mechanical cooling electrical distribution block 104 could include a drop-in (e.g., "plug-and-play") container configuration or individual pieces of equipment configured or connected in a prescribed method to perform the redundant function or provide the redundant capacity. This allows the design of the mechanical cooling system to be separated from the primary design of the electrical power system.

Each mechanical cooling electrical distribution block 104 includes a main board 106 and mechanical cooling equipment, including one or more fans (not shown), pumps 109, and/or chillers 110. The main board 106 is upstream of the pumps 109 and chillers 110. The main board 106 provides power to the mechanical cooling equipment. One or more generators 107 and/or transformers 108 in the mechanical cooling electrical distribution block 104 can generate or provide the power to the main board 106. In addition, one or more generators 111 in the redundancy power distribution block 102 and/or one or more transformers 112 in the redundancy power distribution block 102 can generate and/or provide the power to the main board 106. In some embodiments, the main board 106 can be supported by generators 111 in the redundancy power distribution block 102 and/or transformers 112 in the redundancy power distribution block 102 that are larger or greater in number than the capacity required by the mechanical cooling electrical distribution blocks 104.

The mechanical cooling electrical distribution blocks 104 provide the specific airflow and/or fluid flow used to keep the computing devices 115 in the data center 120 within the prescribed thermal envelope as part of the data center compute critical load electrical distribution. That is, the fans, pumps 109, and/or chillers 110 in each mechanical cooling electrical distribution block 104 are used to generate and distribute cooled air for cooling the computing devices 115 in the data center 120. These components are part of the critical load electrical distribution.

While the system 100 is shown with two mechanical cooling electrical distribution blocks 104, this is merely one example. Other embodiments can include any number of mechanical cooling electrical distribution blocks 104 greater than one. In general, the quantity and capacity of the mechanical cooling electrical distribution blocks 104 is customizable to provide a modular mechanical equipment electrical isolation topology that can be added to the site in increments as prescribed by the owner or specifications. These cooling requirements can change over time.

In the event of power failure in either of the mechanical cooling electrical distribution blocks 104, the redundancy power distribution block 102 can provide the power to the failing mechanical cooling electrical distribution block 104 through an electrical path 105 as part of the N+1 redundancy design. The redundancy power distribution block 102 can provide at least as much power capacity as any of the mechanical cooling electrical distribution blocks 104, in order to ensure the "Isolated Redundant" design. In some embodiments, the modular mechanical system(s) can use the capacity of the redundancy power distribution block 102 if a higher priority demand is not present. In some embodiments, one or more electrical system controls can determine, through programming, what the priorities of each demand are, and switch between the priorities through a series of relays, circuit breakers, Automatic Transfer Switches (ATS), Static Transfer Switches (STS), or the like.

The system 100 can be configured for different levels of redundancy. For example, in some embodiments, the system 100 can be configured without redundancy in a Normal ("N") configuration. In other embodiments, the system can be configured with a minimum redundancy in a Normal Plus One ("N+1") configuration. In other embodiments, the system can be configured with a redundancy in Two times Normal ("2N") configuration. In still other embodiments, the system 100 can be configured with a robust redundancy in Two times Normal Plus One ("2N+1") configuration.

When the system 100 is configured for a redundant topology, the capacity of the redundancy power distribution block 102 should be at least as large as the capacity of the largest mechanical cooling electrical distribution block 104 so that any failed mechanical cooling electrical distribution block 104 can be backed up by the redundancy power distribution block 102. In some embodiments, the redundancy power distribution block 102 can be configured for more than one capacity critical component or for a larger capacity critical component. For example, in anticipation of possible larger capacities of future mechanical cooling electrical distribution blocks 104, the redundancy power distribution block 102 can be configured with an emergency power generator or additional equipment pads with connectivity paths. This provides "future proofing" of the redundancy power distribution block 102 by installing or pre-building for unknown future requirements of additional power generation within the mechanical cooling electrical distribution blocks 104.

When the system 100 is configured for a non-redundant topology, any size of mechanical cooling electrical distribution block 104 can be added to the data center mechanical line up. Without a redundancy requirement, each mechanical cooling electrical distribution block 104 is a stand-alone system that does not rely on any other component or capacity from another source.

Figure 2:
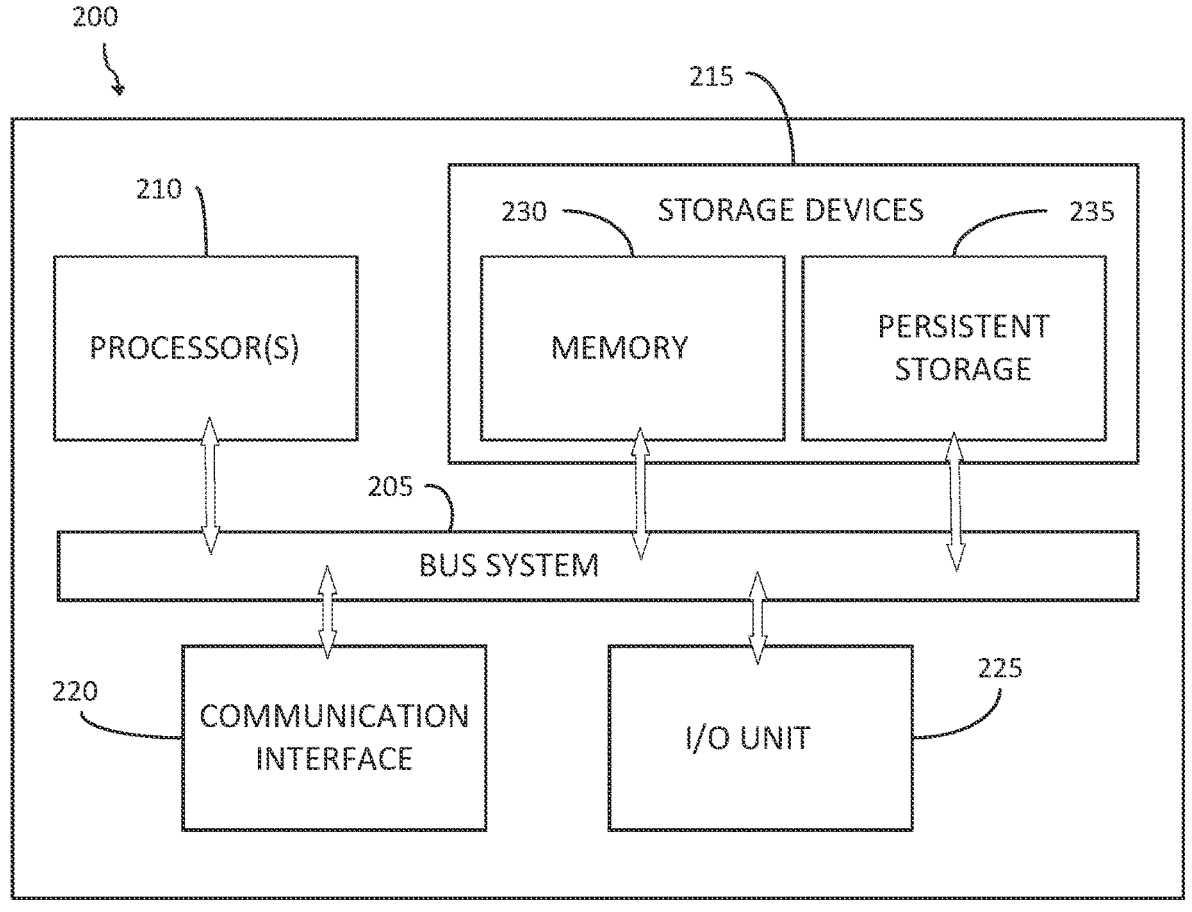
FIG. 2 illustrates an example of a computing device for use in a data center electrical power distribution system according to this disclosure.

FIG. 2 illustrates an example of a computing device 200 for use in a data center electrical power distribution system according to this disclosure. The computing device 200 can be configured to control any of the operations discussed herein, including control of operation of any of the disclosed sensors, actuators, and the like, and performance of any disclosed algorithms or processes.

As shown in FIG. 2, the computing device 200 includes a bus system 205, which supports communication between processor(s) 210, storage devices 215, communication interface (or circuit) 220, and input/output (I/O) unit 225. The processor(s) 210 executes instructions that may be loaded into a memory 230. The processor(s) 210 may include any suitable number(s) and type(s) of processors or other devices in any suitable arrangement. Example types of processor(s) 210 include microprocessors, microcontrollers, digital signal processors, field programmable gate arrays, application specific integrated circuits, and discrete circuitry.

The memory 230 and a persistent storage 235 are examples of storage devices 215, which represent any structure(s) capable of storing and facilitating retrieval of information (such as data, program code, and/or other suitable information on a temporary or permanent basis). The memory 230 may represent a random access memory or any other suitable volatile or non-volatile storage device(s). The persistent storage 235 may contain one or more components or devices supporting longer-term storage of data, such as a read-only memory, hard drive, Flash memory, or optical disc. For example, persistent storage 235 may store one or more databases of data, standards data, results, data, client applications, etc.

The communication interface 220 supports communications with other systems or devices. For example, the communication interface 220 could include a network interface card or a wireless transceiver facilitating communications over any of the disclosed components of the system 100. The communication interface 220 may support communications through any suitable physical or wireless communication link(s). The I/O unit 225 allows for input and output of data. For example, the I/O unit 225 may provide a connection for user input through a keyboard, mouse, keypad, touchscreen, or other suitable input devices. The I/O unit 225 may also send output to a display, printer, or other suitable output devices.

Although FIG. 2 illustrates one example of a computing device 200, various changes may be made to FIG. 2. For example, various components in FIG. 2 could be combined, further subdivided, or omitted and additional components could be added according to particular needs. As a particular example, while depicted as one system, the computing device 200 may include multiple computing systems that may be remotely located. In another example, the computing device 200 may be a personal electronic device, such as, a phone, tablet, or laptop, or provide or update a user interface, e.g., via a software application, or other communications interface to a personal electronic device for control, management, information, and or access to the computing device 200 and/or any aspects of the systems disclosed herein.

FIG. 3 is a flowchart illustrating an example process 300 for providing redundant electrical power for mechanical cooling according to this disclosure. The embodiment of the process 300 shown in FIG. 3 is for illustration only. Other embodiments of the process 300 could be used without departing from the scope of this disclosure.

Referring to FIG. 3, in operation 301, one or more power distribution blocks 101 provide power to computing devices 115 in a data center 120. This could include, for example, one or more main boards 106 in each power distribution block 101 providing power to the computing devices 115.

In operation 303, one or more mechanical cooling electrical distribution blocks 104 provide mechanical cooling to the computing devices 115. This could include, for example, one or more main boards 106 in each mechanical cooling electrical distribution block 104 providing power to the mechanical cooling equipment, which generates and distributes cooled air to the computing devices 115.

In operation 305, a power failure is detected in at least one of the one or more mechanical cooling electrical distribution blocks 104. This could include, for example, a sensor detecting an interruption in the delivery of power to the mechanical cooling equipment.

In operation 307, in response to the detected power failure, a redundancy power distribution block 102 is instructed to provide electrical power to the failing mechanical cooling electrical distribution block 104 through an electrical path 105.

The process 300 discussed above illustrates example operations that can be implemented in accordance with the principles of the present disclosure, and various changes could be made to the process 300. For example, while shown as a series of steps, various steps in the process 300 could overlap, occur in parallel, occur in a different order, or occur multiple times. In another example, steps may be omitted or replaced by other steps.

It is noted that various figures and portions of the specification may list example values or ranges of values. These are provided by way of example only and any suitable alternative value or value range may be used in embodiments of the present disclosure.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "such as," when used among terms, means that the latter recited term(s) is(are) example(s) and not limitation(s) of the earlier recited term. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described herein can be implemented or supported by one or more computer programs, each of which is formed from computer readable program code and embodied in a computer-readable medium. The terms "application" and "program" refer to one or more computer programs, software components, sets of instructions, procedures, functions, objects, classes, instances, related data, or a portion thereof adapted for implementation in a suitable computer readable program code. The phrase "computer-readable program code" includes any type of computer code, including source code, object code, and executable code. The phrase "computer-readable medium" includes any type of medium capable of being accessed by a computer, such as read-only memory (ROM), random access memory (RAM), a hard disk drive, a compact disc (CD), a digital video disc (DVD), or any other type of memory. A "non-transitory" computer-readable medium excludes wired, wireless, optical, or other communication links that transport transitory electrical or other signals. A non-transitory, computer-readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases. Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claim scope. The scope of the patented subject matter is defined by the claims.

What is claimed is:

1. A system comprising:
    one or more power distribution blocks configured to provide power to multiple computing devices in a data center, wherein the one or more power distribution blocks comprise an "N" configuration representing equipment required to support a critical load of the multiple computing devices of the data center;
    a redundancy power distribution block configured to provide redundant power to the multiple computing devices in the data center, wherein the redundancy power distribution block combined with the one or more power distribution blocks comprises an "N+1" redundancy configuration; and
    multiple mechanical cooling electrical distribution blocks electrically coupled to the system through only the redundancy power distribution block, wherein the multiple mechanical cooling electrical distribution blocks are electrically segregated from the one or more power distribution blocks, and wherein each mechanical cooling electrical distribution block is configured to provide mechanical cooling to the multiple computing devices in the data center,
    wherein, in response to detection of a power failure in at least one of the mechanical cooling electrical distribution blocks, the redundancy power distribution block is further configured to provide electrical power to the at least one mechanical cooling electrical distribution block exhibiting the power failure, and
    wherein the redundancy power distribution block has a power capacity equal to or greater than: (i) power loads associated with each of the one or more power distribution blocks and (ii) power loads associated with each of the mechanical cooling electrical distribution blocks.

2. The system of claim 1, wherein each of the mechanical cooling electrical distribution blocks comprises at least one pump and at least one chiller configured to generate cooled air for the mechanical cooling.

3. The system of claim 1, wherein each of the mechanical cooling electrical distribution blocks comprises:
    a main board electrically coupled to an electrical path;
    one or more generators configured to generate power to the main board; and
    one or more transformers configured to provide power to the main board.

4. The system of claim 1, wherein each of the mechanical cooling electrical distribution blocks is modular and configured to be added or detached from the system.

5. The system of claim 1, wherein the redundancy power distribution block comprises:

a main board electrically coupled to an electrical path;

one or more generators configured to generate power to the main board; and one or more transformers configured to provide power to the main board.

6. The system of claim 1, wherein the redundancy power distribution block is configured to supply electrical power to the mechanical cooling electrical distribution blocks based on power demand priorities in the system, wherein at least one of the mechanical cooling electrical distribution blocks is configured to use the power capacity of the redundancy power distribution block when a higher priority demand in the system is not present.

7. The system of claim 1, wherein each of the one or more power distribution blocks comprises at least one of: a generator, a transformer, a pump, a fan, an uninterruptible power supply (UPS), or a power distribution unit (PDU).

8. The system of claim 1, further comprising:

the data center comprising the multiple computing devices.

9. A method comprising:

providing power to multiple computing devices in a data center using one or more power distribution blocks, wherein the one or more power distribution blocks comprise an "N" configuration representing equipment required to support a critical load of the multiple computing devices of the data center;

providing redundant power capabilities for the multiple computing devices in the data center using a redundancy power distribution block, wherein the redundancy power distribution block combined with the one or more power distribution blocks comprises an "N+1" redundancy configuration;

providing mechanical cooling to the multiple computing devices in the data center using multiple mechanical cooling electrical distribution blocks that are electrically coupled to a system comprising the one or more power distribution blocks, the redundancy power distribution block, and the data center through only the redundancy power distribution block, and further electrically segregated from the one or more power distribution blocks;

detecting a power failure in at least one of the mechanical cooling electrical distribution blocks; and in response to detecting the power failure in the at least one mechanical cooling electrical distribution block, providing electrical power to the at least one mechanical cooling electrical distribution block using the redundancy power distribution block, wherein the redundancy power distribution block has a power capacity equal to or greater than: (i) power loads associated with each of the one or more power distribution blocks and (ii) power loads associated with each of the mechanical cooling electrical distribution blocks.

10. The method of claim 9, wherein each of the mechanical cooling electrical distribution blocks comprises at least one pump and at least one chiller configured to generate cooled air for the mechanical cooling.

11. The method of claim 9, wherein each of the mechanical cooling electrical distribution blocks comprises:

a main board electrically coupled to an electrical path;

one or more generators configured to generate power to the main board; and one or more transformers configured to provide power to the main board.

12. The method of claim 9, wherein each of the mechanical cooling electrical distribution blocks is modular and configured to be added or detached from the system.

13. The method of claim 9, wherein the redundancy power distribution block comprises:

a main board electrically coupled to an electrical path;

one or more generators configured to generate power to the main board; and one or more transformers configured to provide power to the main board.

14. The method of claim 9, wherein the redundancy power distribution block is configured to supply electrical power to the mechanical cooling electrical distribution blocks based on power demand priorities in the system, wherein at least one of the mechanical cooling electrical distribution blocks is configured to use the power capacity of the redundancy power distribution block when a higher priority demand in the system is not present.

15. The method of claim 9, wherein each of the one or more power distribution blocks comprises at least one of: a generator, a transformer, a pump, a fan, an uninterruptible power supply (UPS), or a power distribution unit (PDU).

16. The method of claim 9, wherein the power is provided to the multiple computing devices via at least one electrical path.

* * * * *